(12) United States Patent
Gupta et al.

(10) Patent No.: US 10,145,937 B2
(45) Date of Patent: Dec. 4, 2018

(54) DYNAMIC IQ MISMATCH CORRECTION IN FMCW RADAR

(71) Applicant: Texas Instruments Incorporated, Dallas, TX (US)

(72) Inventors: Pankaj Gupta, Rajasthan (IN); Sriram Murali, Karnataka (IN); Karthik Ramasubramanian, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 222 days.

(21) Appl. No.: 15/088,566

(22) Filed: Apr. 1, 2016

(65) Prior Publication Data

US 2017/0285140 A1 Oct. 5, 2017

(51) Int. Cl.
*G01S 7/35* (2006.01)
*G01S 13/34* (2006.01)
(Continued)

(52) U.S. Cl.
CPC ............ *G01S 7/352* (2013.01); *G01S 13/343* (2013.01); *G01S 13/931* (2013.01);
(Continued)

(58) Field of Classification Search
CPC .. G01S 7/352; G01S 13/343; G01S 2007/358; G01S 2013/9332;
(Continued)

(56) References Cited

U.S. PATENT DOCUMENTS

| 4,475,088 A | * | 10/1984 | Beard | H03D 1/2245 |
| | | | | 327/254 |
| 5,150,128 A | * | 9/1992 | Kongelbeck | G01S 7/4021 |
| | | | | 342/102 |

(Continued)

FOREIGN PATENT DOCUMENTS

CN 102221689 A 4/2016

OTHER PUBLICATIONS

International Search Report and Written Opinion in PCT/US2017/025743, dated Oct. 5, 2017 (6 pages).

*Primary Examiner* — Bernarr E Gregory
(74) *Attorney, Agent, or Firm* — Gregory J. Albin; Charles A. Brill; Frank D. Cimino (57) ABSTRACT

A FMCW radar receiver includes a LO providing a chirped LO signal, an in-phase (I) channel for outputting I-data and a quadrature (Q) channel for outputting Q-data. A dynamic correction parameter generator generates IQ phase correction values (P[n]s) and IQ gain correction values (G[n]s) based on a frequency slope rate of the chirped LO signal for generating during intervals of chirps including a first sequence of P[n]s and G[n]s during a first chirp and a second sequence of P[n]s and G[n]s during a second chirp. An IQ mismatch (IQMM) correction circuit has a first IQMM input coupled to receive the I-data and a second IQMM input receiving the Q-data, and the P[n]s and G[n]s. During the first chirp the IQMM correction circuit provides first Q'-data and first I'-data and during the second chirp the IQMM correction circuit provides at least second Q'-data and second I'-data.

19 Claims, 7 Drawing Sheets

(51) Int. Cl.
*G01S 13/93* (2006.01)
*G01S 13/00* (2006.01)

(52) U.S. Cl.
CPC ............... *G01S 2007/358* (2013.01); *G01S 2013/9314* (2013.01); *G01S 2013/9332* (2013.01)

(58) Field of Classification Search
CPC ............ G01S 2013/9314; G01S 7/285; G01S 7/4021; G01S 7/5205; H03D 1/2245; H04L 27/00; H04L 27/22
See application file for complete search history.

(56) References Cited

U.S. PATENT DOCUMENTS

| | | | |
|---|---|---|---|
| 5,188,114 A * | 2/1993 | Thiele | G01S 7/5205 600/455 |
| 5,757,311 A | 5/1998 | Voyce | |
| 6,859,507 B2 * | 2/2005 | Camp | H04L 27/22 375/224 |
| 2005/0107059 A1* | 5/2005 | Lehning | H04L 27/00 455/303 |
| 2005/0275583 A1* | 12/2005 | Mikami | G01S 7/285 342/109 |
| 2009/0042521 A1 | 2/2009 | Otaka et al. | |
| 2015/0276918 A1 | 10/2015 | Ramasubramanian et al. | |

\* cited by examiner

DYNAMIC IQ MISMATCH CORRECTION IN FMCW RADAR

FIELD

Disclosed embodiments relate to and gain and phase correction of quadrature receivers used in quadrature Frequency Modulation Continuous Wave (FMCW) radar systems.

BACKGROUND

Radar is used in many applications to detect target objects such as airplanes, military targets, vehicles, and pedestrians. Radar finds use in a number of applications associated with a motor vehicle such as for adaptive cruise control, collision warning, blind spot warning, lane change assist, parking assist and rear collision warning. Pulse radar and FMCW radar are conventionally used in such applications.

In a radar system, a local oscillator (LO) generates a transmit signal. A voltage controlled oscillator (VCO) converts a voltage variation into a corresponding frequency variation. The transmit signal is amplified and transmitted by one or more transmit units. In FMCW radar, the frequency of the transmit signal is varied linearly with time. For example, the frequency of the transmit signal may increase at a constant linear ramp rate from 77 GHz to 81 GHz in a period of about 100 microseconds. This transmit signal is referred as a ramp signal or a chirp signal. One or more obstacles scatters (or reflects) the transmit signal which is received by one or more receive units in the FMCW radar system.

A baseband signal is obtained from a mixer which mixes the transmitted LO signal and the received scattered signal that is termed an intermediate frequency (IF) signal. The IF signal is signal conditioned by a conditioning circuit which includes an amplifier and an anti-alias filter and is then sampled by an analog to digital converter (ADC) and processed by a processor to estimate a distance and a velocity of the one or more nearby obstacles. The frequency of the IF signal is proportional to the range (distance) of the obstacle(s).

Traditionally FMCW radar receivers use an in-phase (I) only receiver. However, an IQ receiver having an I channel and a quadrature-phase (Q) channel allows forming I and Q components of the received signals to generate an IF signal which includes both phase and amplitude data without a loss of information. This helps in improving the noise figure of the radar system compared to an I-only receiver by suppressing (to the extent of the image rejection ratio (IMRR)) fold-back of negative frequency components, including noise, and also helps keep the image band visible for external interference monitoring.

However, IQ imbalances are known to occur due to mismatches between the parallel sections (or channels) of the receiver chain providing the I signal path and the Q signal path. In FMCW radar the LO signal is a ramp signal, the same as the transmit signal, and a copy of that ramp signal is delayed (or advanced) by 90 degrees. When the direct LO output is mixed by a mixer with the original received signal, this produces the I signal, whereas when the 90° shifted LO output is mixed with the original received signal that produces the Q signal. In the analog domain, the delay is never exactly 90 degrees, and similarly the analog gain is never perfectly matched between the I signal path and the Q signal path.

SUMMARY

This Summary briefly indicates the nature and substance of this Disclosure. It is submitted with the understanding that it will not be used to interpret or limit the scope or meaning of the claims.

Disclosed embodiments recognize for quadrature receivers having an in-phase (I) channel and a quadrature-phase (Q) channel the mismatch in the gain (G) and phase (P) between the I channel and Q channel (IQ mismatch) can significantly vary as a function of frequency across the local oscillator (LO) RF frequency band. For vehicle applications the Frequency Modulation Continuous Wave (FMCW) chirp can have a wide bandwidth of up to about 4 GHz. The variation in IQ mismatch over the frequency band is due to mismatches between the I circuit components and Q circuit components of the quadrature receiver, such as the between the mixers and filters in the respective channels. This mismatch variation over the RF frequency band is generally worsened by the industry shift from SiGe-based to Si-based complementary metal-oxide semiconductor (CMOS) radar integrated circuits (ICs) for enabling cost reductions.

Uncorrected IQ mismatch (IQMM) for quadrature receivers of FMCW radar systems degrades receiver performance due to image band fold-back onto the desired signal band. It is recognized that although static (fixed) mismatch correction values can be used for IQ mismatch correction for both gain and for phase, a static correction scheme is recognized to fail when a wide RF frequency band (e.g., 4 GHz) is used due to frequency dependent gain/phase variations of the RF response of mismatched I and Q channel circuit components. As the LO frequency is ramping over a large sweep bandwidth within a few μsec during radar operation, the RF frequency dependent IQ mismatch translates into time varying IQMM after IQ mixing, leading to degraded image band performance of the radar system.

Disclosed embodiments include a method of IQ mismatch correction for FMCW radar. A IQ FMCW receiver is provided including an in-phase (I) channel comprising a first mixer coupled to receive and mix a chirped local oscillator signal (chirped LO signal) and a received scattered chirped radar signal (chirped radar signal) and a first analog-to-digital (A/D) converter for outputting in-phase (I)-data, and a quadrature (Q) channel including a phase shifter for phase shifting the chirped LO signal to provide a phase shifted chirped LO signal, a second mixer coupled to receive and mix the chirped radar signal and the phase shifted chirped LO signal and a second A/D converter for outputting Q phase (Q)-data. IQ phase correction parameter values (P[n]s) and IQ gain correction parameter values (G[n]s) are dynamically generated based on a slope rate of a frequency of the chirped LO signal including generating different values during a plurality of intervals for each chirp of the chirped LO signal. The P[n]s and G[n]s are coupled to an IQ mismatch (IQMM) correction circuit having a first IQMM input coupled to receive the I-data from the I channel and a second IQMM input for receiving the Q-data from the Q-channel, wherein the IQMM correction circuit provides corrected Q (Q')-data and corrected I (I')-data. The I'-data and Q'-data is processed using a signal processing algorithm to determine at least one radar parameter.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 1:
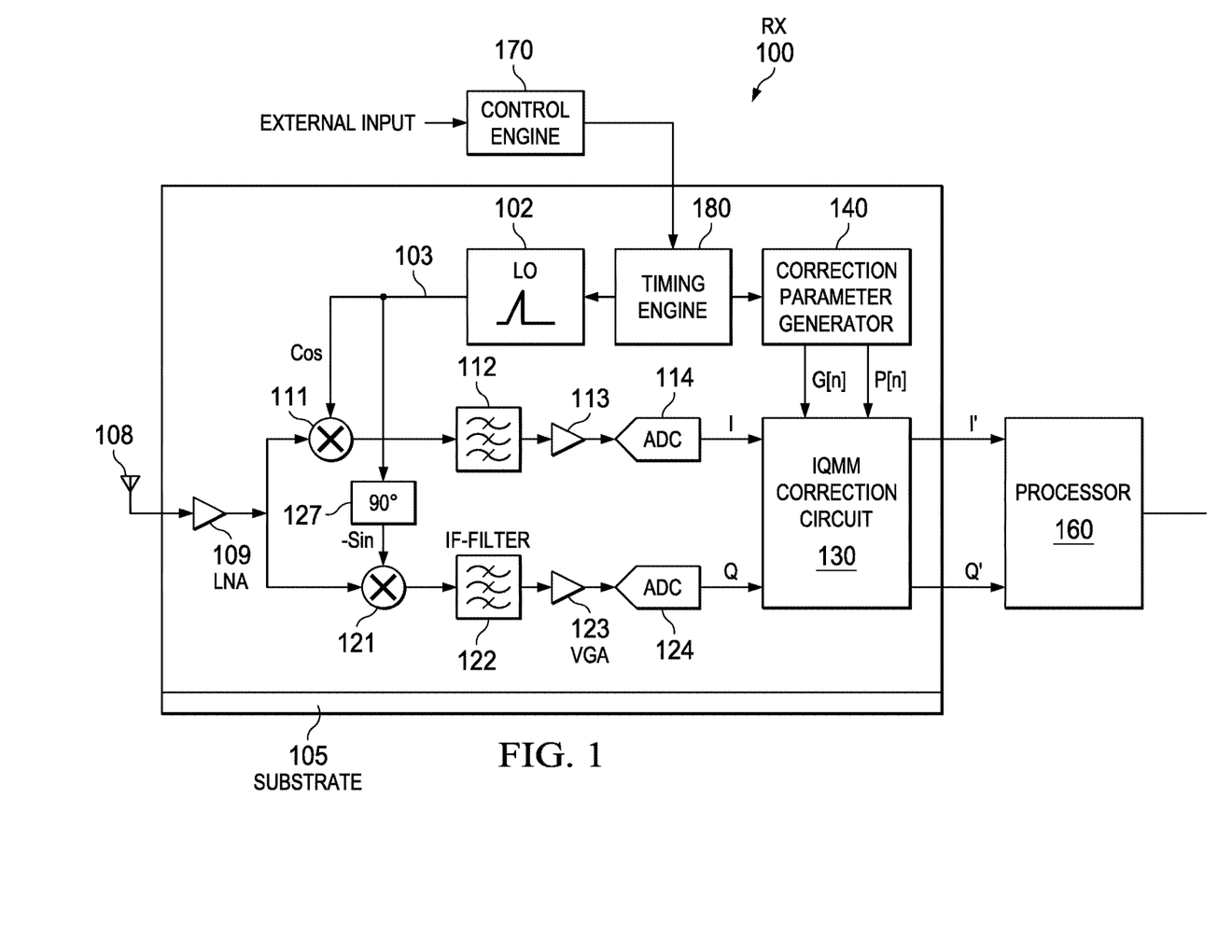
FIG. 1 illustrates an example quadrature FMCW radar receiver including a disclosed dynamic IQ mismatch correction parameter generator, according to an example embodiment.

FIG. 1 illustrates an example quadrature radar receiver (Rx) 100 including a disclosed dynamic IQ mismatch correction parameter generator (dynamic correction parameter generator) 140, according to an example embodiment. Rx 100 is part of an integrated circuit (IC) formed on a substrate 105. The IC can be a CMOS-IC formed on a substrate 105 comprising bulk silicon or silicon epi on bulk silicon, or other substrate arrangements.

The Rx 100 is coupled to receive an RF ramp signal from the local oscillator (LO) 102 shown as a ramping LO signal. In one version, a frequency of the RF signal 103 output by the LO 102 is a varied linearly with time to provide a chirped LO signal, such as increasing at a constant linear rate from 77 GHz to 81 GHz in 100 microseconds. This RF signal 103 is also referred to as a ramp signal or a chirp signal. In another version, the RF signal 103 comprises ramp segments having a start frequency, a fixed slope, and an end frequency.

Rx 100 includes an in-phase (I) channel including a first mixer 111, an IF filter 112 typically including at least a high pass filter for attenuating some strong near-by reflections, a first amplifier 113, and then a first A/D converter 114 coupled to process a scattered chirped radar signal (chirped radar signal) received by Rx antenna 108 from one or more objects after amplification by low noise amplifier (LNA) 109, to generate output sampled I-data. Amplifier 113 can be part of the IF filter 112. In another embodiment, the IF filter 112 is not present in the Rx 100. Rx 100 also includes a Q channel including a +or −90° phase shifter 127, a second mixer 121 and IF filter 122 coupled to receive the chirped radar signal received by the Rx antenna 108 after amplification by LNA 109, a second amplifier 123, then a second A/D converter 124 coupled to receive the quadrature component of the radar signal and output sampled Q-data.

In another embodiment, the IF filter 122 is not present in the Rx 100. The Rx antenna 108 can be on or off the IC of the Rx 100. The Rx 100 may include one or more additional components known to those having ordinary skill in the art of radar that are not disclosed here for simplicity of this description.

Rx 100 is shown including a control engine block (control engine) 170 and a timing engine block (timing engine) 180. The output of the control engine 170 is coupled to an input of the timing engine 180. The control engine 170 can comprise an ARM processor (CPU based on the RISC (reduced instruction set computer) architecture developed by Advanced RISC Machines (ARM)), such as a microcontroller unit (MCU). The timing engine 180 can comprise dedicated hardware. Control engine 170 receives an external input (e.g., over a Serial Peripheral Interface (SPI)). The LO 102 (and some circuits in the digital baseband section of the I and Q channels) can be controlled by the timing engine 180, which can also provide programmability for different slopes, start frequency, and other chirp parameters. An output of the timing engine 180 is also shown coupled to an input of a dynamic correction parameter generator 140.

Figure 3B:
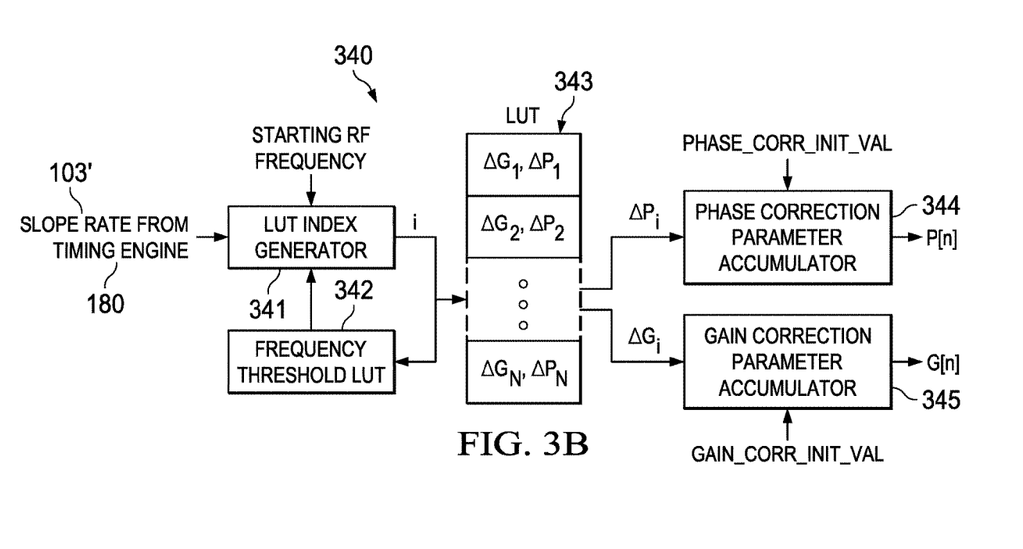
FIG. 3B shows a first example block diagram implementation of a dynamic correction parameter generator, according to an example embodiment.
Figure 4A:
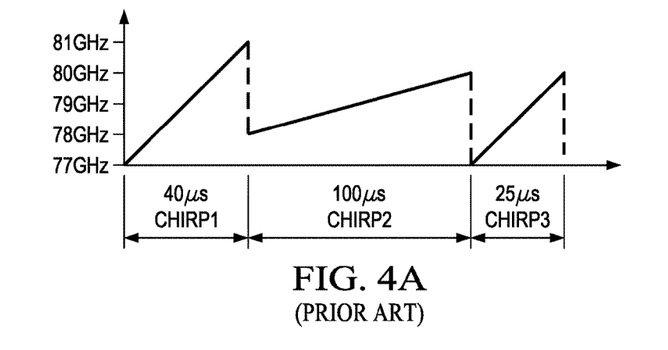
FIG. 4A shows an example chirp diagram showing interleaved different chirps, FIG. 4B an IQ G mismatch correction function for an RF signal over a frequency (f) range, and FIG. 4C a second example block diagram implementation of a dynamic correction parameter generator, according to an example embodiment.
Figure 4C:
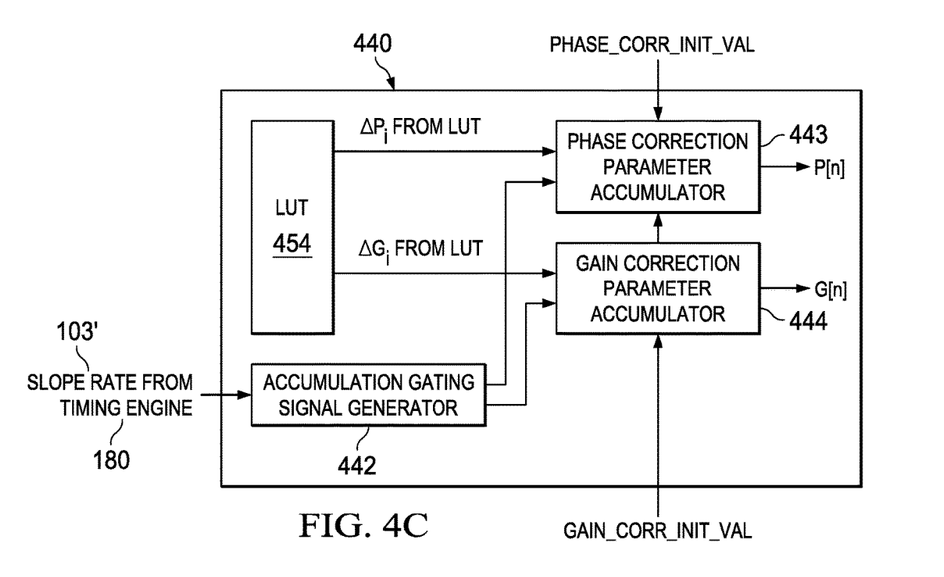
Figure 5:
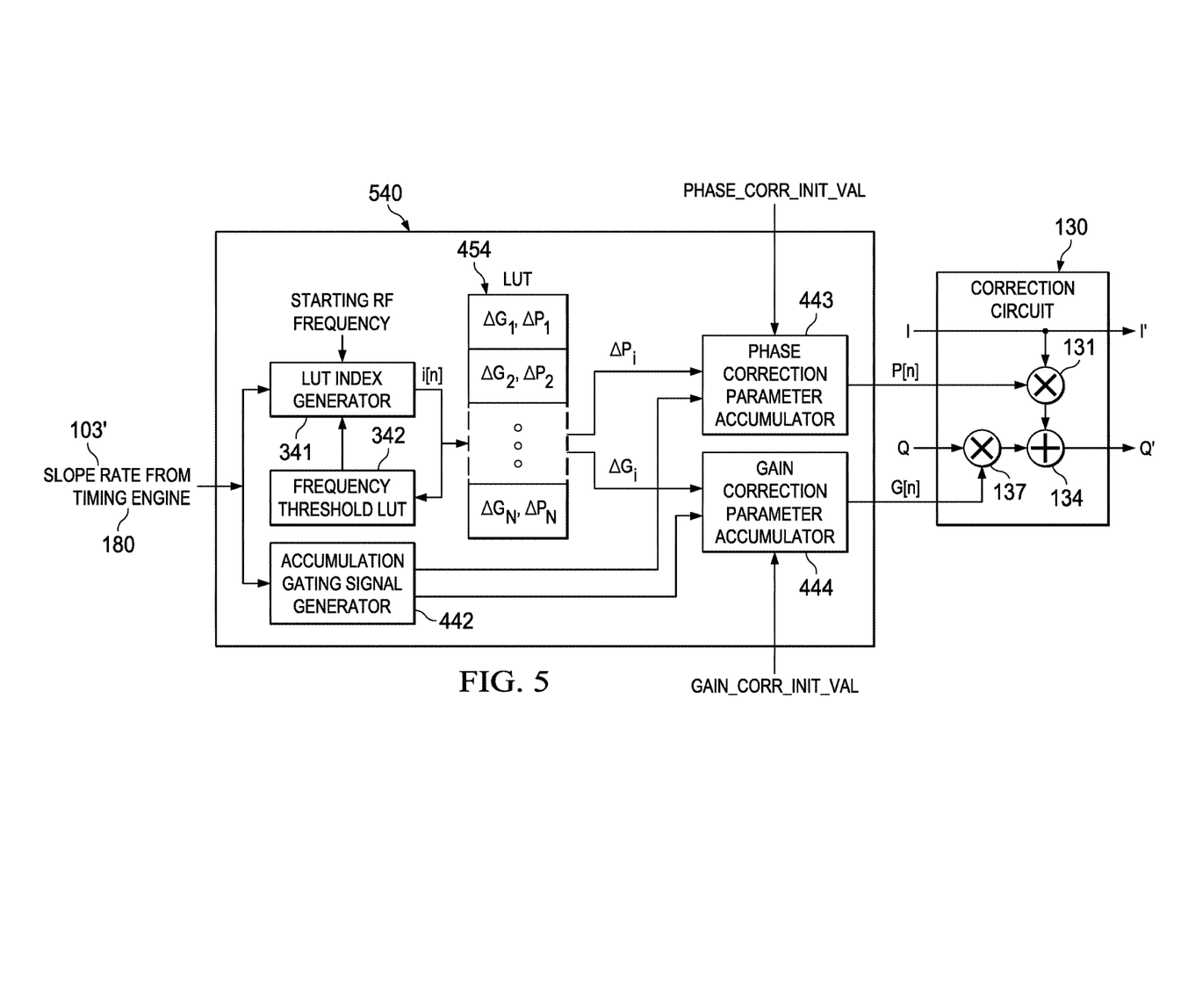
FIG. 5 shows a third example block diagram implementation of a dynamic correction parameter generator having its outputs coupled to an example IQ mismatch correction circuit, according to an example embodiment.

The dynamic correction parameter generator 140 receives information regarding a current frequency of the chirped LO signal from the timing engine 180 and is for generating during a plurality of intervals for each chirp a current (updated) IQ phase correction parameter value (P[n]) and a current IQ gain correction parameter value (G[n]). FIG. 3B, 4C and 5 described below provide example implementations for a dynamic correction parameter generator. An example IQ mismatch (IQMM) correction circuit 130 has a first IQMM input coupled to receive the I-data from the I channel for mixing the I-data and the current P[n], and a second IQMM input for receiving the Q-data from the Q-channel for mixing the Q-data and the current G[n]. IQMM correction circuit 130 outputs G and P corrected IQ-data shown as a corrected I-data (I') output and a corrected Q data (Q') output. In practice, typically only one of the I-data and Q-data is G and P corrected, shown in the example embodiment as only the Q data being G and P corrected in FIG. 5 as described below. The I' and Q' output are provided to the processor 160, where the processor 160 can be on the substrate 105 of the Rx 100 or off the IC. Although not shown, there is generally a high speed interface (HSI) between the IQMM correction circuit 130 and the processor 160. The processor 160 can be a microprocessor, digital signal processor (DSP), or microcontroller unit (MCU). Using the I'-data and Q'-data from multiple intervals per chip and from multiple chirps the processor 160 can estimate a distance and a velocity of the one or more nearby objects or obstacles.

Current G and P IQ correction parameters (G[n], P[n]) provided by the dynamic correction parameter generator 140 are applied during each interval during each chirp duration, with the timing engine 180 timing the changing of the corrections. The dynamic intra-chirp IQMM correction corrects for the RF-frequency dependent IQ circuitry mismatch in G and P that would otherwise translate into time-varying IQ mismatch within durations of each chirp. This provides intra-chirp "µsec-level" time-varying IQMM correction. Although Rx 100 is shown having a single I channel and a single Q channel, disclosed Rx's can include two or more receive channels with their respective I and Q channels to enable implementation of FMCW radar systems that include object angle estimation capability.

Figure 2:
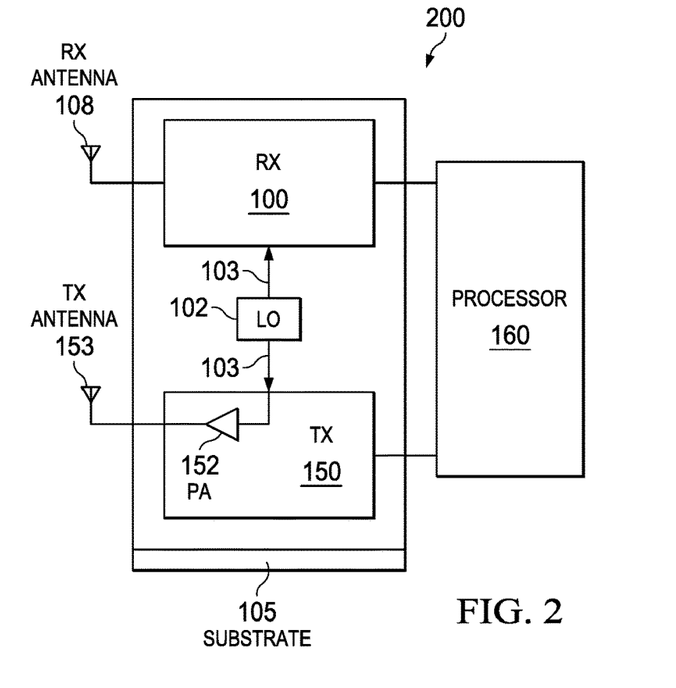
FIG. 2 illustrates an example quadrature FMCW radar system including the radar receiver shown in FIG. 1 along with a transmitter, according to an example embodiment.

FIG. 2 illustrates an example quadrature FMCW radar system 200 including the Rx 100 shown in FIG. 1 along with a transmitter (Tx) 150 on a common substrate 105, according to an example embodiment. The RF signal 103 output by the LO 102 is coupled to the Rx 100 and to the power amplifier (PA) 152 of the Tx 150. The PA 152 drives the Tx antenna 153 which transmits the radar signal over the air. FMCW radar system 200 can include a plurality of I and Q Rx channels and a plurality of Tx channels. In another embodiment the Tx 150 and Rx 100 can be on separate substrates (chips).

The operation of the FMCW radar system 200 is explained now. The LO 102 generates an RF signal 103, where its frequency varies linearly with time (ramped signal), such as by control provided by the timing engine 180 which can provide values for a start frequency and a frequency slope for the RF signal 103. For example, as noted above the frequency of the RF signal 103 can increase at a constant rate from a start frequency of 77 GHz to 81 GHz in 100 µseconds. However, the frequency of the RF signal 103 in one example is dependent on an operating frequency band of the FMCW radar system 200. The Tx 150 receives the RF signal 103 from the LO 102 and generates a first transmit signal that is transmitted over the air by the Tx antenna 153.

A scattered signal is received by the Rx 100. The Rx 100 amplifies the scattered signal to generate an amplified scattered signal. The amplified scattered signal output by LNA 109 is mixed with the RF signal 103 from the LO 102 by mixer 111 in the I channel (or mixer 121 in the Q channel) to generate an intermediate frequency (IF) signal which is filtered by IF filter 112 in the I channel or 122 in the Q channel, amplified by first amplifier 113 in the I channel or second amplifier 123 in the Q channel, and is then sampled by ADC 114 in the I channel or 124 in the Q channel to generate a sampled I-data and sampled Q data, respectively. IQMM correction circuit 130 receives the sampled I-data and sampled Q-data and outputs G and P corrected sampled IQ data shown as I'-data and Q'-data. The processor 160 uses the G and P corrected I' and Q'-data to estimate a position and a velocity of object(s) or obstacle(s). Although not shown, there are typically other digital baseband stages between the ADCs 114, 124 and the IQ correction circuit 130 (such as decimation filters, etc.), and also between the IQ correction circuit 130 and the final G and P corrected data going to the processor 160.

Figure 3A:
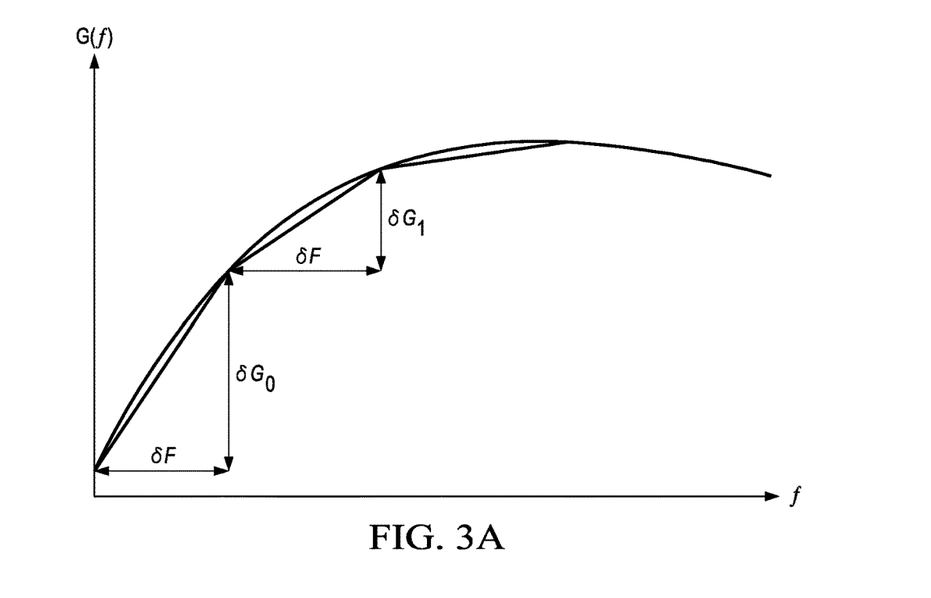
FIG. 3A shows an example piece-wise linear approximation of a IQ G mismatch correction function for an RF signal over a frequency (f) range.

FIG. 3A shows an example piece-wise linear approximation of a IQ G mismatch correction function G(f) over a frequency (f) range corresponding to the RF signal 103. The G(f) shown is not linear. The frequency increment size is shown set to δF is generally set to be small enough so that each interval (or segment) of G(f) is approximately a line segment. δG0 is shown for the first interval and δG1 is shown for the second interval. δG0 is shown being >δG1. G(f) and P(f) can be estimated for each IC using a calibration procedure that involves IQ mismatch calibration at multiple RF frequencies in the RF band utilized. Any suitable method for IQ mismatch calibration can be used, except that multiple RF frequencies are covered and a G(f) and P(f) curve is determined. As described herein, the entire RF band is divided into intervals, the G and P mismatch is calibrated for each interval, and then a curve is fit through the calibration data to populate the LUTs, such as LUT 343 shown in FIG. 3B described below.

FIG. 3B shows a first example block diagram implementation of a dynamic correction parameter generator 340, according to an example embodiment. Correction parameter generator 340 has a multiplier-free low complexity architecture that generates piece-wise linear IQ correction parameter values G[n] and P[n] by storing ΔG and ΔP (incremental IQ correction value updates) in a LUT 343 for each interval in the f-range used. A digital representation of the slope rate 103' of the instantaneous (real-time) LO frequency is shown provided by the timing engine 180, a starting RF frequency, and the output of a frequency threshold LUT 342 are all shown provided to LUT index generator 341. The purpose of the frequency threshold LUT 342 is to allow for non-uniform frequency intervals instead of the uniform δF examples shown in FIGS. 3A and 4B.

The LUT index generator 341 selects the values for ΔGi and ΔPi from the LUT 343 shown having ΔG and ΔP pair values for a plurality of different frequency intervals δF in the f-range, such as δF intervals of 10 MHz from 77 GHz to 81 GHz (400 intervals in this particular case). The particular frequency interval δF that the current RF freq is in determines the ΔG, ΔP pair output by the LUT 343, shown as ΔGi, ΔPi which represent the incremental G and P correction values for $i^{th}$ interval, according to the relations:

$$\Delta G_i = \left(\frac{\delta G}{\delta f}\right)_i \frac{ChirpRampSlope}{SampRate}$$

$$\Delta P_i = \left(\frac{\delta P}{\delta f}\right)_i \frac{ChirpRampSlope}{SampRate}$$

Accordingly, the SlopeRate=ChirpRampSlope/SampRate. For example, the SampRate can be 100 MHz in one particular embodiment. The incremental (current) phase correction value ΔPi is supplied to a phase correction parameter accumulator 344 along with a phase correction initial value which outputs the current P[n], and the incremental gain correction value ΔGi is supplied to a gain correction parameter accumulator 345 along with a gain correction initial value which outputs the current G[n]. Since the ΔG, ΔP entries in the LUT 343 depend on the slope of the chirp, this generally necessitates reprogramming of the LUT 343 every time chirp profile changes, such as when the FMCW radar system uses inter-leaved chirp profiles (e.g., see the example inter-leaved chirps having different chirp ramp slopes in FIG. 4A described below).

Modern FMCW transceivers support inter-leaving of various chirp profiles which can have different chirp ramp slope, sweep bandwidth and starting RF frequency. FIG. 4A shows 3 example inter-leaved chirps each chirp with a different ramp slope, different sweep bandwidth and different starting RF frequency. To address inter-leaved chirp FMCW radar system applications another embodiment is provided that uses a chirp profile independent (invariant) gated accumulation technique.

Figure 4B:
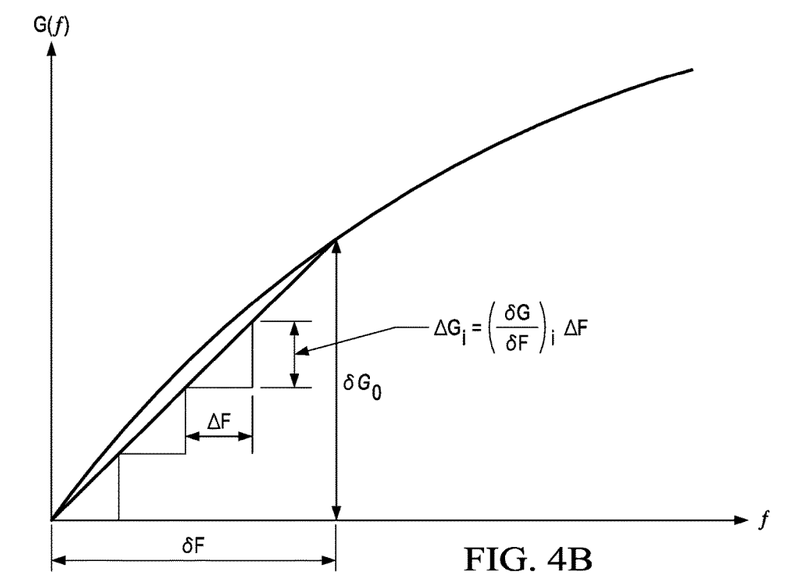

FIG. 4B is an example IQ G mismatch correction function (G(f)) for an RF signal over a frequency (f) range. The incremental change in IQ gain mismatch correction ΔGi is equal to $(\delta G/\delta f)_i \Delta F$.

FIG. 4C is a second example block diagram implementation of a dynamic correction parameter generator 440, according to an example embodiment. Dynamic correction parameter generator 440 operates by populating a LUT 454 with an incremental change in G correction values ΔGi and an incremental change in P correction values ΔPi for each absolute frequency jump (ΔF) in each interval. The accumulation gating signal generator 442 monitors the change in RF frequency in the RF signal 103 based on accumulation of the slope rate 103'.

Phase correction parameter accumulator 443 receives a phase correction initial value and ΔPi from LUT 454 and outputs a current P[n] and gain correction parameter accumulator 444 receives a gain correction initial value and ΔGi from LUT 454 and outputs a current G[n]. Each time the accumulation gating signal generator 442 determines that the RF signal 103 frequency has jumped by ΔF (by accumulating the slope rate 103'), it triggers accumulation of ΔGi in the gain correction parameter accumulator 444 and accumulation of ΔPi in the phase correction parameter accumulator 443. Correction parameter generator 440 avoids reprogramming the LUT 454 based on the chirp slope and makes the Rx work seamlessly across various inter-leaved chirp profiles as the accumulator gating signal from the accumulation gating signal generator 442 enables the LUT entries in LUT 454 to be invariant to the FMCW slope.

FIG. 5 shows a third example block diagram implementation of a dynamic correction parameter generator 540 having its outputs coupled to an example IQ mismatch correction circuit 130, according to an example embodiment. Dynamic correction parameter generator 540 couples the slope rate 103' to input of an accumulation gating signal generator 442 and to an input of a LUT index generator 341 so that both LUT index generator 341 and accumulation gating signal generator 442 accumulate the slope rate to generate LUT Index the and accumulation gating signal, respectively. LUT index generator 341 also receives the starting RF frequency signal, a frequency threshold signal from frequency threshold LUT 342 to allow for non-uniform frequency intervals of instead of the uniform OF examples shown in FIGS. 3A and 4B, and LUT index generator 341 outputs a slope-rate-based LUT index selection signal shown as i[n] to the LUT 454. Phase correction parameter accumulator 443 receives a phase correction initial value and ΔPi from LUT 454 and outputs a current P[n] value and gain correction parameter accumulator 444 receives a gain correction initial value and ΔGi from LUT 454 and outputs a current G[n] value. Dynamic correction parameter generator 540 thus responds to LO frequency changes linearly during a chirp with LUT index generation and gating signal generation.

The current P[n] and G[n] outputs from the dynamic correction parameter generator 540 are shown coupled to IQ mismatch correction circuit 130. IQ mismatch correction circuit 130 has a first IQMM input coupled to receive the I-data from the I channel (see I in FIG. 1 above) including a third mixer 131 for mixing the I-data and the current P[n] value, and a second IQMM input for receiving the Q-data from the Q-channel (see Q in FIG. 1 above) coupled to a fourth mixer 137 for mixing the Q-data and the current G[n] value. IQMM correction circuit 130 includes a summing node 134 which is coupled to receive outputs from the third mixer 131 and the fourth mixer 137, where the summing node 134 is shown providing a corrected Q data (Q') output. IQ mismatch correction circuit 130 is shown outputting I-data as I'-data (where I-data=I'-data). IQ mismatch correction circuit 130 can be implemented in a variety of other ways. For example, the I-data may be G and P corrected instead of the Q data.

Figure 6:
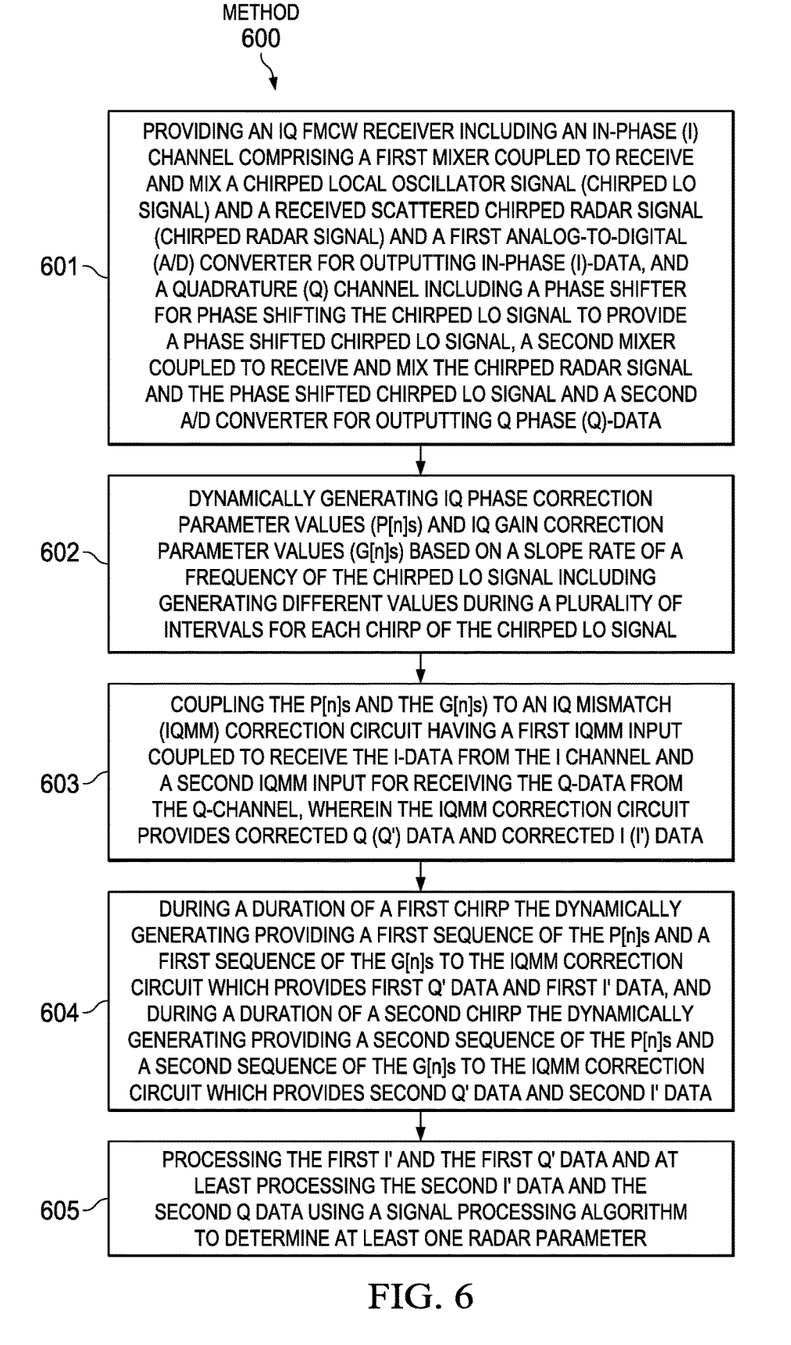
FIG. 6 is a flow chart that shows steps in an example method of dynamic IQ mismatch correction for quadrature FMCW radar, according to an example embodiment.

FIG. 6 is a flow chart that shows steps in an example method 600 of dynamic IQ mismatch correction for FMCW radar, according to an example embodiment. Step 601 comprises providing an IQ FMCW receiver including an in-phase (I) channel comprising a first mixer coupled to receive and mix a chirped local oscillator signal (chirped LO signal) and a received scattered chirped radar signal (chirped radar signal) and a first analog-to-digital (A/D) converter for outputting in-phase (I)-data, and a quadrature (Q) channel including a phase shifter for phase shifting the chirped LO signal to provide a phase shifted chirped LO signal, a second mixer coupled to receive and mix the chirped radar signal and the phase shifted chirped LO signal and a second A/D converter for outputting Q phase (Q)-data. Step 602 comprises dynamically generating IQ phase correction parameter values (P[n]s) and IQ gain correction parameter values (G[n]s) based on a slope rate of a frequency of the chirped LO signal including generating different values during a plurality of intervals for each chirp of the chirped LO signal.

Step 603 coupling P[n]s and G[n]s to an IQ mismatch (IQMM) correction circuit having a first IQMM input coupled to receive the I-data from the I channel and a second IQMM input for receiving the Q-data from the Q-channel, wherein the IQMM correction circuit provides corrected Q (Q') data and corrected I (I') data. Step 604 comprises during a duration of a first chirp the dynamic generating providing a first sequence of the P[n]s and first sequence of the G[n]s and the IQMM correction circuit providing first Q' data and first I'-data, and during a duration of a second chirp the dynamic generating providing a second sequence of the P[n]s and a second sequence of the G[n]s different from the first sequence during a second chirp and the IQMM correction circuit providing second Q' data and second I'-data. Step 605 comprises processing the first I' and first Q' data and processing at least the second I'-data and second Q'-data using a signal processing algorithm to determine at least one radar parameter.

EXAMPLES

Disclosed embodiments are further illustrated by the following specific Examples, which should not be construed as limiting the scope or content of this Disclosure in any way.

Figure 7A:
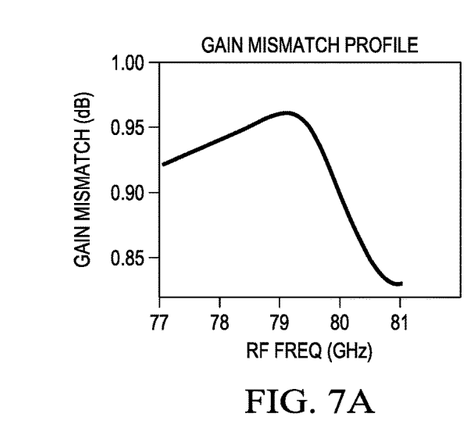
FIG. 7A shows an example IQ G mismatch for a silicon CMOS-based quadrature FMCW receiver, FIG. 7B an example IQ P mismatch profile for the FMCW receiver.
Figure 7B:
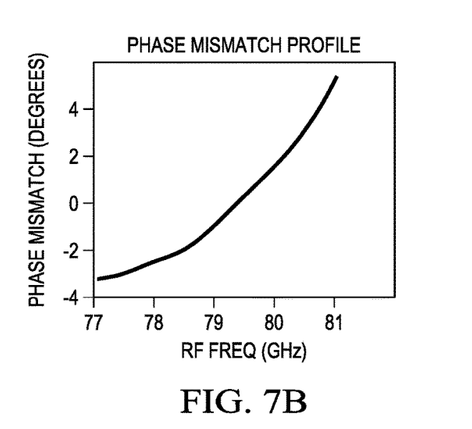
Figure 7C:
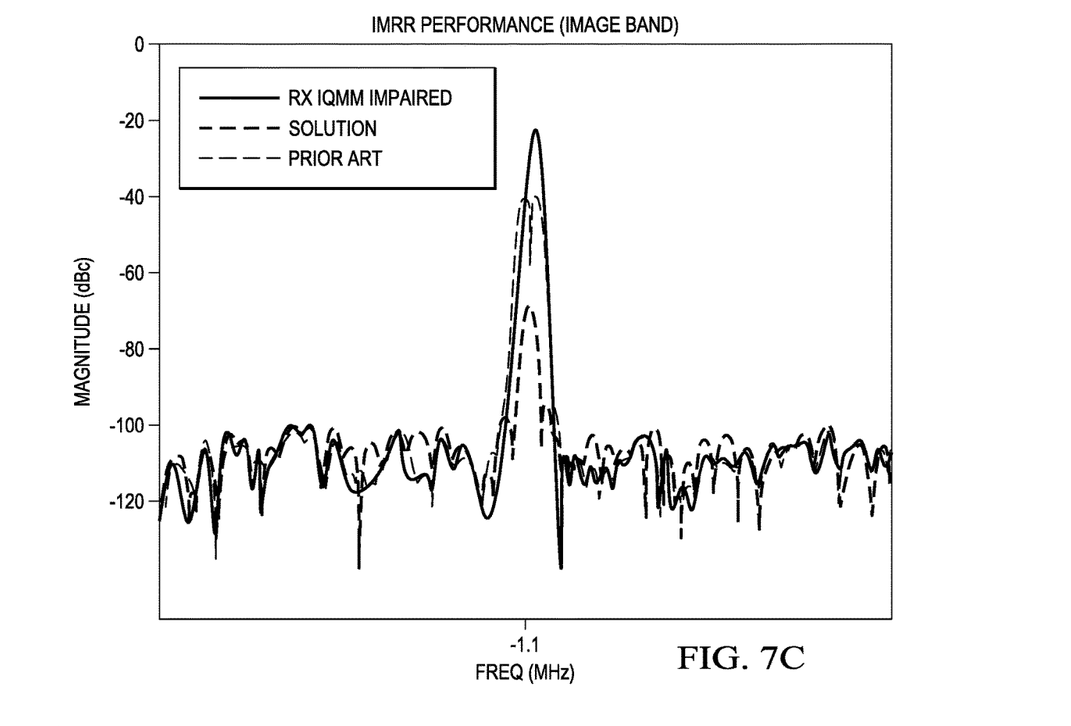
FIG. 7C shows the image band performance of an FMCW radar system including the silicon CMOS-based quadrature receiver without correction, image band performance of the same FMCW radar system with a static IQ mismatch correction scheme for G and P, and image band performance of same FMCW radar system modified to include disclosed dynamic IQ mismatch correction for G and P, according to an example embodiment.

FIG. 7A shows an example IQ G mismatch for a silicon CMOS-based quadrature FMCW receiver over a band from 77 to 81 GHz (chirp sweep bandwidth of 4 GHz), and FIG. 7B an example IQ P mismatch profile for the FMCW receiver over the band from 77 to 81 GHz. FIG. 7C shows the image band performance of an FMCW radar system including the silicon CMOS-based quadrature receiver without correction, image band performance of the same FMCW radar system with a known static IQ mismatch correction scheme for G and P, and image band performance of same FMCW radar system modified to include disclosed dynamic IQ mismatch correction for G and P, according to an example embodiment.

The simulation was performed for an IF signal at 1.1 MHz. The uniform frequency intervals were 100 MHz. The uncorrected IQ mismatch results in an IMMR of about −25 dBc. The known static correction scheme for G and P IQ mismatch correction is shown failing the IMRR specification of −45 dBc. The disclosed receiver architecture/method shown as "solution" (receiver architecture based FIG. 5) is shown correcting the IQMM sufficiently to provide better than −70 dBc of IMRR which is a nearly 30 dB improvement over the known static correction scheme for the G and P IQ mismatch.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure. For example, in certain applications it may be possible to correct only one of the G and P of the IQ-data.

The invention claimed is:

1. A method of IQ mismatch correction for Frequency Modulation Continuous Wave (FMCW) radar, comprising:
   providing an IQ FMCW receiver including an in-phase (I) channel comprising a first mixer coupled to receive and mix a chirped local oscillator signal (chirped LO signal) and a received scattered chirped radar signal (chirped radar signal) and a first analog-to-digital (A/D) converter for outputting in-phase (I)-data, and a quadrature (Q) channel including a phase shifter for phase shifting said chirped LO signal to provide a phase shifted chirped LO signal, a second mixer coupled to receive and mix said chirped radar signal and said phase shifted chirped LO signal and a second A/D converter for outputting Q phase (Q)-data;
   dynamically generating IQ phase correction parameter values (P[n]s) and IQ gain correction parameter values (G[n]s) based on a slope rate of a frequency of said chirped LO signal including generating different values during a plurality of intervals for each chirp of said chirped LO signal;
   coupling said P[n]s and said G[n]s to an IQ mismatch (IQMM) correction circuit having a first IQMM input coupled to receive said I-data from said I channel and a second IQMM input for receiving said Q-data from said Q-channel,
   wherein said IQMM correction circuit provides corrected Q (Q') data and corrected I (I') data.

2. The method of claim 1, wherein said dynamically generating further comprises generating a first sequence of said P[n]s and a first sequence of said G[n]s during a first chirp and a second sequence of said P[n]s and a second sequence of said G[n]s different from said first sequence of said P[n]s and G[n]s during a second chirp, and
   wherein during a duration of said first chirp said IQMM correction circuit provides first Q' data and first I' data and during a duration of said second chirp said IQMM correction circuit provides second Q' data and second I' data.

3. The method of claim 1, wherein said dynamically generating comprises utilizing delta ($\Delta$) G IQ correction values ($\Delta$G[n]s) and $\Delta$P IQ correction values ($\Delta$P[n]s) stored in a look-up table (LUT), and wherein based on said slope rate and a starting frequency of said chirped LO signal during each said chirp a LUT index generator causes said LUT to output a selected one of said $\Delta$G[n]s to a gain correction parameter accumulator to generate each one of said G[n]s and one of said $\Delta$P[n]s to a phase correction parameter accumulator to generate each one of said P[n]s.

4. The method of claim 3, wherein said LUT index generator provides selection of a new frequency threshold from a frequency threshold look-up table (LUT) based on a current LUT index provided by said LUT index generator.

5. The method of claim 1, wherein said dynamically generating comprises gated accumulating comprising populating a look-up table (LUT) with an incremental change in a value of said G[n]s and said P[n]s for an absolute jump in frequency ($\Delta$F) of said chirped LO signal for each of said plurality of intervals across a frequency band for said chirped LO signal,
   wherein an accumulation gating signal generator receives said slope rate for monitoring a change in said frequency of said chirped LO signal based on an accumulation of said slope rate and is coupled to trigger gated accumulations in said gain correction parameter accumulator to output each one of said G[n]s and said phase correction parameter accumulator to output each one of said P[n]s by performing gated accumulations every said $\Delta$F, and
   wherein said slope rate is further coupled to a LUT index generator that is coupled to provide a slope-rate-based LUT index selection signal to said LUT.

6. The method of claim 5, wherein said LUT index generator includes selection of a new frequency threshold from a frequency threshold look-up table (LUT) based on a current LUT index provided by said LUT index generator.

7. The method of claim 1, wherein said IQ FMCW receiver comprises a CMOS receiver on a silicon substrate, and said method further comprises processing at least said I' data and said Q' data using a signal processing algorithm to determine at least one radar parameter.

8. A synchronous Frequency Modulation Continuous Wave (FMCW) radar receiver, comprising:
   a substrate that said receiver is formed on;
   a local oscillator (LO) controlled for providing a chirped LO signal;
   an in-phase (I) channel comprising a first mixer coupled to receive and mix said chirped LO signal and a received scattered chirped radar signal (chirped radar signal) and a first analog-to-digital (A/D) converter for outputting in-phase (I)-data, and a quadrature (Q) channel including a phase shifter for phase shifting said chirped LO signal to provide a phase shifted chirped LO signal, a second mixer coupled to receive and mix said chirped radar signal and said phase shifted chirped LO signal and a second A/D converter for outputting Q phase (Q)-data;
   a dynamic correction parameter generator for dynamically generating IQ phase correction parameter values (P[n]s) and IQ gain correction parameter values (G[n]s) based on a slope rate of a frequency of said chirped LO signal provided by a timing engine, the dynamic correction parameter generator generating different values during a plurality of intervals for each chirp of said chirped LO signal, and an IQ mismatch (IQMM) correction circuit including at least a third mixer having a first IQMM input coupled to receive said I-data from said I channel and a second IQMM input for receiving said Q-data from said Q-channel, said IQMM correction circuit coupled to receive said P[n]s and said G[n]s;

wherein said IQMM correction circuit provides corrected Q (Q')-data and corrected I (I')-data.

9. The FMCW radar receiver of claim 8, wherein said dynamic correction parameter generator generates a first sequence of said P[n]s and a first sequence of said G[n]s during a first chirp and a second sequence of said P[n]s and a second sequence of said G[n]s different from said first sequence of said P[n]s and G[n]s during a second chirp, wherein during a duration of said first chirp said IQMM correction circuit provides first Q'-data and first I'-data and during a duration of said second chirp said IQMM correction circuit provides second Q'-data and second I'-data.

10. The FMCW radar receiver of claim 8, wherein said dynamic correction parameter generator utilizes delta (Δ) G IQ correction values (ΔG[n]s) and ΔP IQ correction values (ΔP[n]s) stored in a look-up table (LUT), and wherein based on said slope rate and a starting frequency of said chirped LO signal during each said chirp a LUT index generator causes said LUT to output a selected one of said ΔG[n]s to a gain correction parameter accumulator to generate each one of said G[n]s and one of said ΔP[n]s to a phase correction parameter accumulator to generate each one of said P[n]s.

11. The FMCW radar receiver of claim 10, wherein said LUT index generator selects of a new frequency threshold from a frequency threshold look-up table (LUT) based on a current LUT index provided by said LUT index generator.

12. The FMCW radar receiver of claim 8, wherein said dynamic correction parameter generator performs gated accumulating at least in part by populating a look-up table (LUT) with an incremental change in a value of said G[n]s and said P[n]s for an absolute jump in frequency (ΔF) of said chirped LO signal for each of said plurality of intervals across a frequency band for said chirped LO signal, and wherein an accumulation gating signal generator receives said slope rate for monitoring a change in said frequency of said chirped LO signal based on an accumulation of said slope rate and is coupled to trigger gated accumulations in said gain correction parameter accumulator to output each one of said G[n]s and said phase correction parameter accumulator to output each one of said P[n]s by performing gated accumulations every said ΔF, and wherein said slope rate is received by a LUT index generator that is coupled to provide a slope-rate-based LUT index selection signal to said LUT.

13. The FMCW radar receiver of claim 12, wherein said LUT index generator selects a new frequency threshold from a frequency threshold look-up table (LUT) based on a current LUT index provided by said LUT index generator.

14. The FMCW radar receiver of claim 8, further comprising a processor formed on said substrate for processing said first I'-data and said first Q'-data and processing at least said second I'-data and said second Q'-data using a signal processing algorithm to determine at least one radar parameter.

15. A Frequency Modulation Continuous Wave (FMCW) radar system, comprising:

a substrate that a receiver and a transmitter are both formed on;

said receiver comprising:

a local oscillator (LO) controlled for providing a chirped LO signal;

an in-phase (I) channel comprising a first mixer coupled to receive and mix said chirped LO signal and a received scattered chirped radar signal (chirped radar signal) and a first analog-to-digital (A/D) converter for outputting in-phase (I)-data, and a quadrature (Q) channel including a phase shifter for phase shifting said chirped LO signal to provide a phase shifted chirped LO signal, a second mixer coupled to receive and mix said chirped radar signal and said phase shifted chirped LO signal and a second A/D converter for outputting Q phase (Q)-data;

a dynamic correction parameter generator for dynamically generating IQ phase correction parameter values (P[n]s) and IQ gain correction parameter values (G[n]s) based on a slope rate of a frequency of said chirped LO signal provided by a timing engine, the dynamic correction parameter generator generating different values during a plurality of intervals for each chirp of said chirped LO signal, and an IQ mismatch (IQMM) correction circuit including at least a third mixer having a first IQMM input coupled to receive said I-data from said I channel including and a second IQMM input for receiving said Q-data from said Q-channel, said IQMM correction circuit coupled to receive said P[n]s and said G[n]s;

wherein said IQMM correction circuit provides corrected Q (Q')-data and corrected I (I')-data, said transmitter including a power amplifier (PA) coupled to receive said chirped LO signal and to drive a Tx antenna.

16. The FMCW radar system of claim 15, wherein said dynamic correction parameter generator generates a first sequence of said P[n]s and a first sequence of said G[n]s during a first chirp and a second sequence of said P[n]s and a second sequence of said G[n]s different from said first sequence of said P[n]s and G[n]s during second chirp, wherein during a duration of said first chirp said IQMM correction circuit provides first Q'-data and first I'-data and during a duration of said second chirp said IQMM correction circuit provides second Q'-data and second I'-data.

17. The FMCW radar system of claim 15, wherein said dynamic correction parameter generator utilizes delta (Δ) G IQ correction values (ΔG[n]s) and ΔP IQ correction values (ΔP[n]s) stored in a look-up table (LUT), and wherein based on said slope rate and a starting frequency of said chirped LO signal during each said chirp a LUT index generator causes said LUT to output a selected one of said ΔG[n]s to a gain correction parameter accumulator to generate each one of said G[n]s and one of said ΔP[n]s to a phase correction parameter accumulator to generate each one of said P[n]s.

18. The FMCW radar system of claim 17, wherein said LUT index generator selects a new frequency threshold from a frequency threshold look-up table (LUT) based on a current LUT index provided by said LUT index generator.

19. The FMCW radar system of claim 15, further comprising a processor formed on said substrate for processing said first I'-data and said first Q'-data and processing at least said second I'-data and said second Q'-data using a signal processing algorithm to determine at least one radar parameter.

* * * * *